United States Patent
Kimura et al.

(10) Patent No.: US 6,770,812 B2
(45) Date of Patent: Aug. 3, 2004

(54) METAL HOUSING WITH AUXILIARY PARTS GLUED TO HOUSING BASE

(75) Inventors: Koichi Kimura, Kawasaki (JP); Kota Nishii, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 3 days.

(21) Appl. No.: 10/286,845

(22) Filed: Nov. 4, 2002

(65) Prior Publication Data

US 2003/0162046 A1 Aug. 28, 2003

(30) Foreign Application Priority Data

Feb. 27, 2002  (JP) ........................................ 2002-051844

(51) Int. Cl.[7] .................................................. H05K 5/00
(52) U.S. Cl. ........................................ 174/52.1; 174/50
(58) Field of Search ...................... 174/356 GC, 35 MS, 174/50, 52.1; 361/816, 818

(56) References Cited

U.S. PATENT DOCUMENTS 4,662,967 A * 5/1987 Bogan et al. ................ 156/242

FOREIGN PATENT DOCUMENTS

| JP | 5-49114 | 2/1993 |
|----|---------|--------|
| JP | 7-221482 | 8/1995 |
| JP | 10-107475 | 4/1998 |
| TW | 420969 | 2/2001 |

* cited by examiner

Primary Examiner—Hung V. Ngo
(74) Attorney, Agent, or Firm—Armstrong, Kratz, Quintos, Hanson & Brooks, LLP

(57) ABSTRACT

A metal housing is composed of a housing base and auxiliary components such as a sidewall frame, internally threaded bosses and a rib. The housing base is prepared by sheet metal forming, while the auxiliary components are prepared by die-casting, thixo molding or forging. The auxiliary components are fixed to the housing base by an adhesive that contains metal powder consisting of metal particles.

11 Claims, 5 Drawing Sheets

METAL HOUSING WITH AUXILIARY PARTS GLUED TO HOUSING BASE

BACKGROUND OF THE INVENTION

1. Field of the Invention

The present invention relates to a metal housing used for producing an electronic device such as a notebook computer or a personal digital assistant (PDA).

2. Description of the Related Art

The housing of a mobile electronic device such as a notebook computer or a PDA should meet several requirements. For instance, the housing should be strong enough to carry the incorporated components safely. Also, the housing should have high thermal conductivity for effective cooling of the incorporated components. Further, to be economical with resources, the housing should be made of a material that can be easily recycled. In light of these, the housing of a recent mobile electronic device is often made of metal rather than resin.

Mobile electronic devices, such as notebook computers and PDAs, need to be small in weight and size for convenience of carriage. Producing a lightweight device needs lightweight components. In a mobile electronic device, the metal housing may often occupy more than 30% of the gross weight, and thus it is important to make the housing lightweight for achieving the total weight reduction of the mobile device. Materials suitable for making such a lightweight housing are light metals, such as magnesium (Mg) and aluminum (Al), or light alloys whose main component is one of these light materials. Among the above-mentioned light metals, magnesium is very popular for producing a metal housing because of its high specific tensile strength, effective heat-dissipating nature (which rivals Al) and low specific gravity, which is about 70% of the specific gravity of aluminum.

As known in the art, various manufacturing methods, such as sheet metal forming, die-casting or thixo molding, can be employed to form a metal housing from a lightweight material.

To produce a metal housing by sheet metal forming, use may be made of "deep drawing" in forming e.g. a sidewall of the housing. When employed alone, however, the deep drawing may fail to provide certain shapes necessary for the desired housing. Further, the sheet metal forming does not allow the simultaneous production of a principal housing component (or a main body, to which the incorporated circuits are grounded) and auxiliary parts (bosses, ribs, etc.). To provide a complete housing, the auxiliary parts and the main body need to be prepared separately, and the auxiliary parts should be fixed to the housing body by using e.g. screws. JP-A-5(1993)-49114 and JP-A-10(1998)-107475, for example, disclose such a screw-fixing technique. Unfavorably, the screwing is a time-consuming process, lowering the production efficiency.

The die-casting and the thixo molding, on the other hand, are more efficient methods for producing a metal housing than sheet metal forming. According to them, the auxiliary parts can be formed integral with the main housing body by pouring a molten metal into a die cavity corresponding to the desired shape.

There is, however, a problem in producing a metal housing by die-casting or thixo molding. To provide a lightweight housing, the die cavity should be narrow so that the resultant casting (i.e. the housing) will have as many thin-walled portions as possible. Unfavorably, the narrow space of the die cavity may impede the otherwise smooth flow of the supplied molten metal.

Even if the die cavity has a sufficiently wide passage for the molten metal, the flow-impeding problem can be caused by the complicated inner configurations of the molding die that are designed to provide the auxiliary housing parts (the sidewall portion, the bosses, the ribs, etc.) formed integral with the main housing body. Due to this configuration complexity, the supplied molten metal may not be able to flow smoothly in the cavity. Consequently part of the die cavity may remain to be unfilled with the molten metal, thereby producing a defective metal housing.

SUMMARY OF THE INVENTION

The present invention has been proposed under the circumstances described above. It is, therefore, an object of the present invention to provide a metal housing that can be produced with less limitations on the configuration design but with a high yield rate.

According to the present invention, there is provided a metal housing including: a housing base made of metal; a first housing component made of metal; and an adhesive that contains metal powder consisting of metal particles. The housing component is fixed to the housing base by the adhesive.

Typically the housing base is a generally flat metal part constituting the upper or lower cover of the product metal housing. The housing base may be prepared by sheet metal forming, which includes shearing, punching, bending, etc. A thin housing base can be made more properly and with a higher yield rate by sheet metal forming than by die-casting, for example.

Preferably, the housing component, such as a sidewall frame, bosses or ribs, may be prepared by die-casting, thixo molding or forging, for example. In particular, the sidewall frame, which is glued to the housing base, can be more easily and with a higher yield rate by die-casting or thixo molding than by sheet metal forming.

Preferably, the metal powder may be made of the same metal as the housing base or the housing component is.

Preferably, the metal powder may have the same composition as the housing base or the housing component does.

Preferably, the metal housing of the present invention may further include a second housing component made of metal and fixed to the housing base by an adhesive that contains metal powder consisting of metal particles. In this instance, the first housing component may be electrically connected to the housing base, while the second housing component may be electrically unconnected to the housing base.

Preferably, the metal particles may be microencapsulated by an insulating resin layer. In this instance, the metal particles in the adhesive for fixing the first housing component to the housing base may be held in direct contact by rupture of the insulating resin layer, so that the first housing component is electrically connected to the housing base.

Preferably, the housing base or the housing component may be made of a metal selected from the group consisting of Mg, Al, Mg alloy and Al alloy.

Preferably, the metal particles may be made of a metal selected from the group consisting of Mg, Al, Mg alloy and Al alloy.

Preferably, the adhesive may contain a resin selected from the group consisting of epoxy resin, acrylic resin and urethane resin.

Preferably, the adhesive may contain a thermoplastic resin such as polyethylene, polypropylene or polystyrene.

Generally, in a conventional notebook computer, a printed circuit board is grounded to the metal housing via an intervening boss or rib, for example. JP-A-7(1995)-221482 discloses such a grounding technique, in accordance with which the circuit board is electrically connected to any portion of the metal housing. However, there may be an occasion where the printed circuit board needs to be connected to one portion of the metal housing (e.g. for grounding purposes), but should not be connected to another portion of the housing (e.g. for avoiding the adverse effect of the electromagnetic field generated in the housing).

The metal housing of the present invention may be composed of a housing base (principal component) and a sidewall frame (auxiliary component) fixed to the housing base, wherein the fixation is achieved by the application of an adhesive that contains conductive metal particles. By controlling the contact (or non-contact) state between the metal particles, it is possible to prevent the sidewall frame from being electrically connected to the housing base. Advantageously, this arrangement allows the printed circuit board grounded to the housing base to be electrically unconnected to the sidewall frame.

Other features and advantages of the present invention will become apparent from the detailed description given below with reference to the accompanying drawings.

DETAILED DESCRIPTION OF THE PREFERRED EMBODIMENT

A preferred embodiment of the present invention will be described below with reference to the accompanying drawings.

Figure 1:
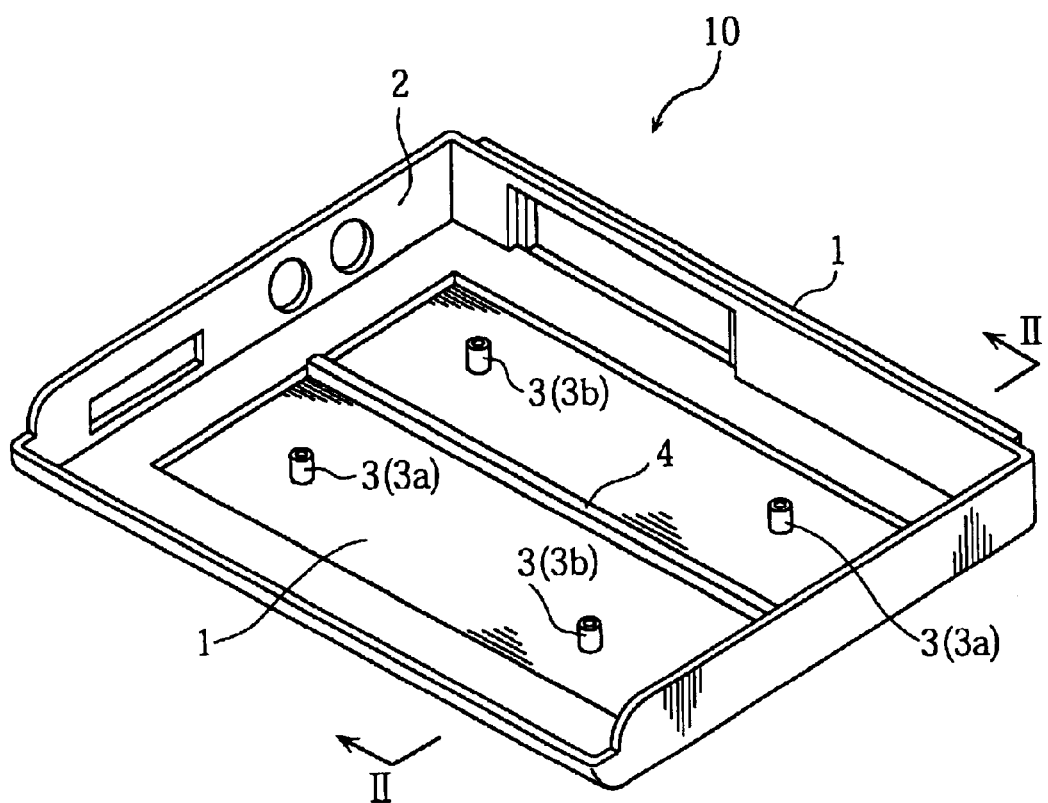
FIG. 1 is a perspective view showing a metal housing embodying the present invention.
Figure 2:
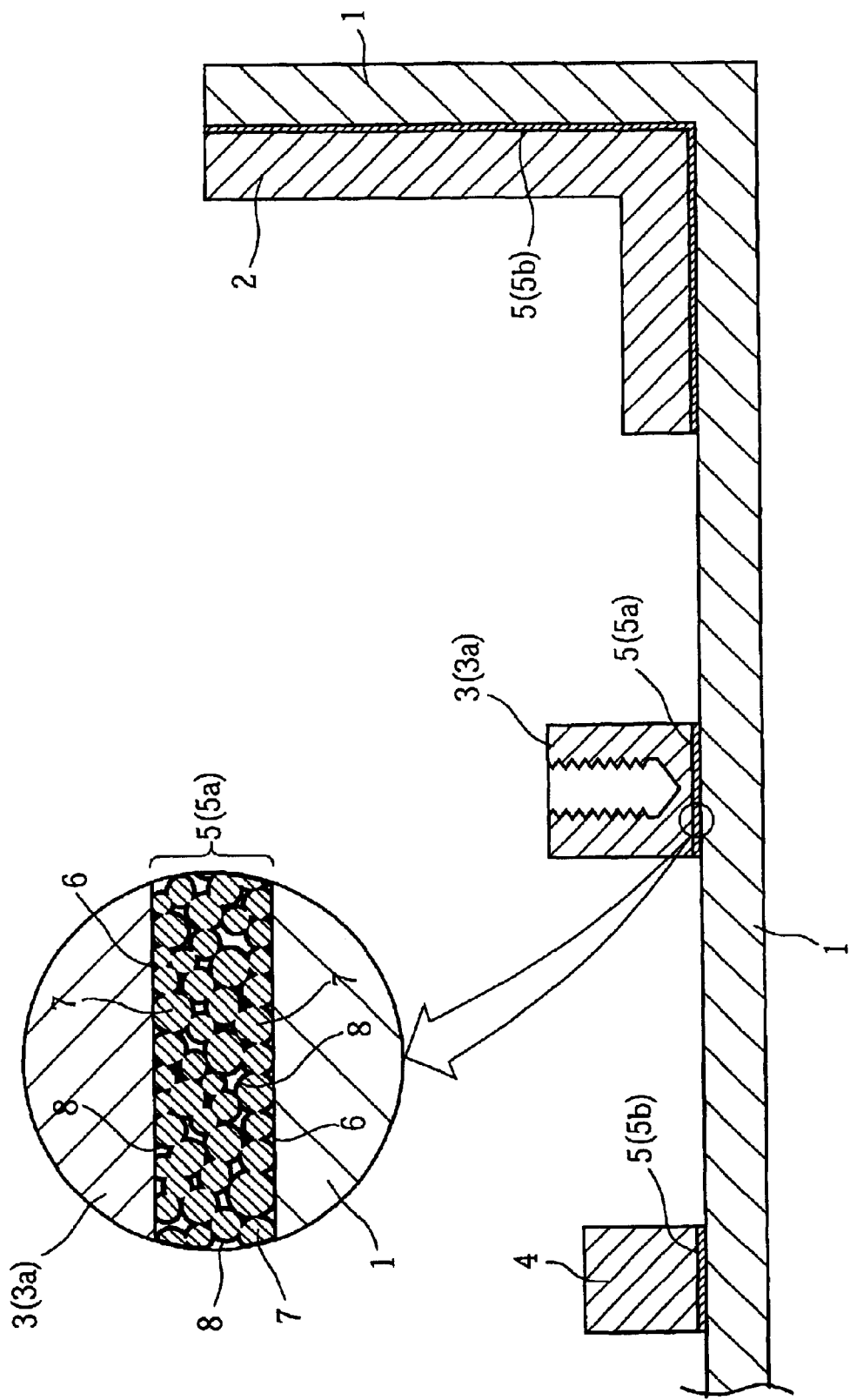
FIG. 2 is a partial sectional view taken along lines II—II in FIG. 1.
Figure 3A:
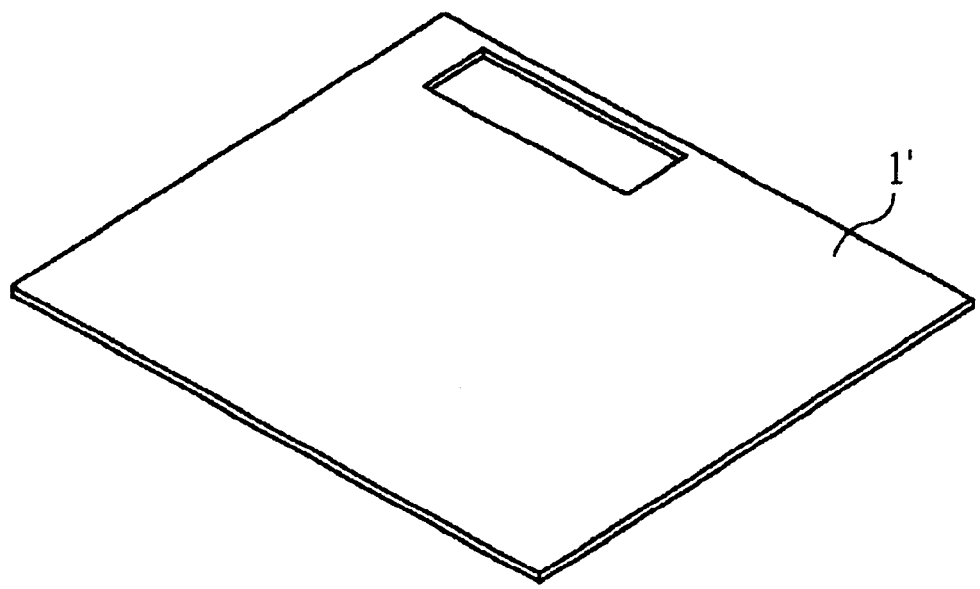
FIGS. 3A–3B show how a housing base is prepared for the metal housing of FIG. 1.
Figure 3B:
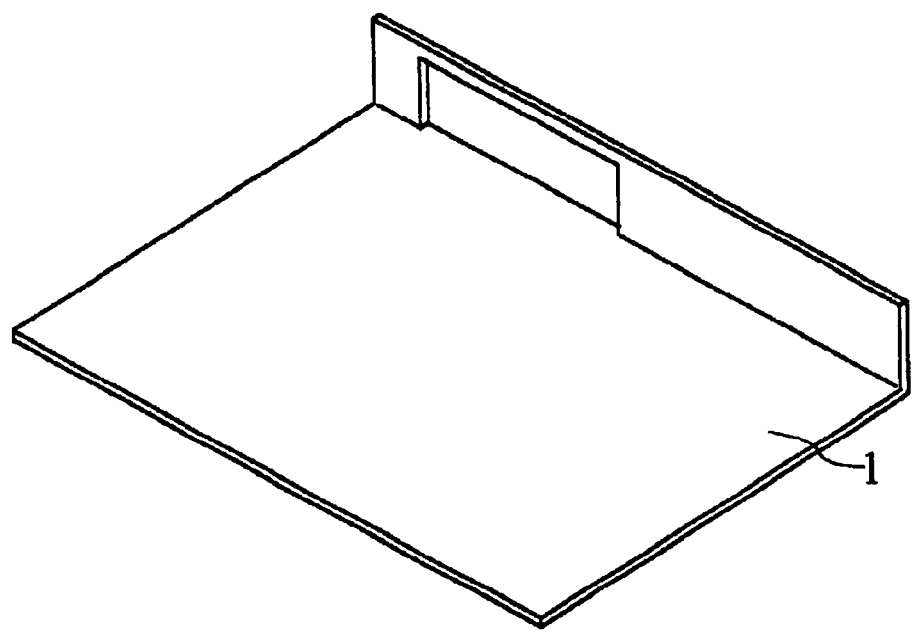
Figure 4:
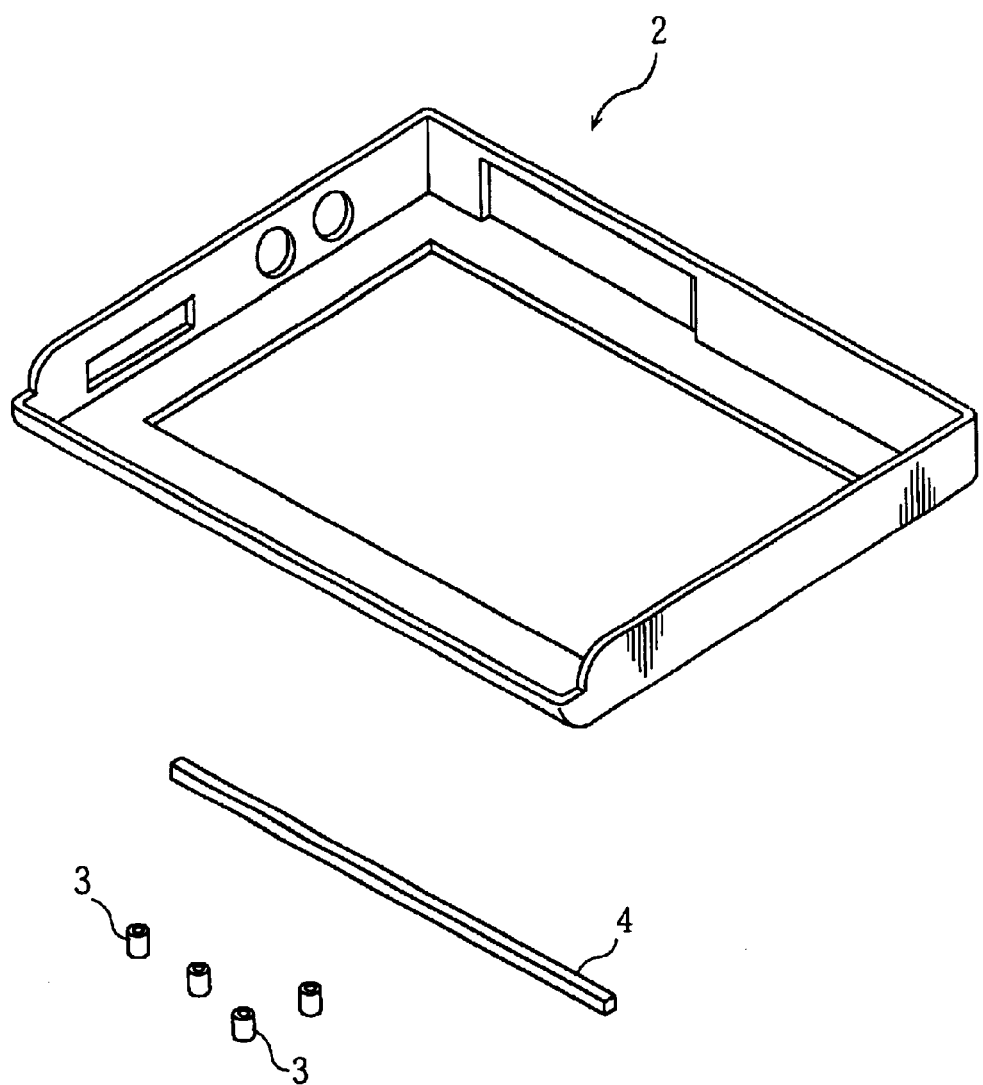
FIG. 4 shows auxiliary components used for providing the metal housing of FIG. 1.

FIGS. 1 and 2 show a metal housing 10 embodying the present invention. Specifically, FIG. 1 is a perspective view of the housing 10, and FIG. 2 is a sectional view taken along lines II—II in FIG. 1. The illustrated metal housing 10, designed for a notebook computer, is composed of a housing base 1 and auxiliary metal components or parts, including a sidewall frame 2, bosses 3 and a rib 4. The housing base 1 may be made of a light metal such as Mg, Al and Ti, or light alloy whose main component is one of these light metals. The thickness of the housing base 1 may be about 0.8 mm. The sidewall frame 2, the bosses 3 and the rib 4 may also be made of a light metal such as Mg, Al and Ti, or light alloy whose main component is one of these light metals. As shown in FIG. 2, these auxiliary parts are fixed to the housing base 1 by adhesive 5.

The housing base 1 and the sidewall frame 2 may be made of aluminum or aluminum-based alloy. The aluminum base 1 and the frame 2 may be subjected to anodizing for providing desired decorative surfaces. The frame 2 may be formed with engaging projections or engaging holes for connection to a display panel or a keyboard assembly.

The adhesive 5 contains base resin 6 and metal particles 7 that are coated with an insulating resin layer 8 (these particles may be referred to as "microencapsulated particles" below). For achieving strong adhesion, the base resin 6 may be an epoxy resin, acrylic resin, or urethane resin. For facilitating the replacement of broken auxiliary parts, a thermoplastic resin, such as polyethylene, polypropylene and polystyrene, may be added to the base resin 6 of the adhesive 5. With this arrangement, the glued auxiliary parts can be easily detached from the housing base 1 simply by heating the adhesive 5 applied between the broken parts and the housing base 1. For achieving both the strong fixation and easy replacement of the auxiliary parts, use may be made of a nitrile or chloroprene rubber-based adhesive. The metal particles 7 in the adhesive 5 may be made of a light metal such as Mg, Al and Ti, or light alloy whose main component is one of these light metals. The particles 7 may be made of the same kind of material as the housing base 1, the bosses 3 or the rib 4. Further, the composition of the material used for the particles 7 may be the same as that for the housing base 1, the bosses 3 or the rib 4.

In the illustrated embodiment, the adhesive 5a (applied between the housing base 1 and the bosses 3a) is made electroconductive, while the adhesive 5b (applied between the housing base 1 and the sidewall frame 2, the bosses 3b, the rib 4) is not. In the electroconductive adhesive 5a, as seen from the enlarged view of FIG. 2, adjacent metal particles 7 are electrically connected to each other due to the partial rupture of the insulating layers 8 on the particles 7. The conductive path provided by these adjacent particles 7 connects the bosses 3a to the housing base 1. In the non-electroconductive adhesive 5b, on the other hand, the contained metal particles 7 are not electrically connected. As a result, the sidewall frame 2, the bosses 3b and the rib 4 are electrically non-connected to the housing base 1.

The above two modes of the adhesive 5 (i.e. electroconductive and non-electroconductive) can be achieved by applying the adhesive under different pressures. Specifically, when the adhesive 5 needs to be electroconductive (like the one between the base 1 and a boss 3a), the applied adhesive is compressed between the two objects (e.g. the base 1 and the boss 3a) under a relatively great pressure for causing the partial rupture in the insulating layers 8 of the particles 7. As stated above, the particles 7 with the ruptured layers are electrically connected to each other, and provide a conduction path between the two objects. On the other hand, when the applied adhesive 5 is not required to be electroconductive (like the one between the base 1 and a boss 3b), the adhesive is compressed under a relatively small pressure so as not to cause the rupture in the insulating layers 8 of the particles 7. As a result, the particles 7 in the adhesive 5 remain to be unconnected, whereby the two objects (e.g. the base 1 and the boss 3b) are insulated.

As described above, in the metal housing 10 of the present invention, the bosses 3a, 3b can be selectively connected (or unconnected) to the same housing base 1. Via these bosses, it is possible to selectively ground a printed circuit board placed in the housing 10.

In the illustrated embodiment, the housing base 1 and the sidewall frame 2 are electrically insulated from each other. Thus, a printed circuit board grounded to the housing base 1 via the bosses 3a is electrically insulated from the sidewall frame 2.

In certain applications, the sidewall frame 2 or the rib 4 may be electrically connected to the housing base 1.

FIGS. 3A–3B, 4 and 5A–5B illustrate the way to produce the metal housing 10. First, the housing base 1 of the metal housing 10 is prepared by processing a metal sheet. Specifically, the material metal sheet is subjected to shearing and punching to provide a semimanufactured base 1' (see FIG. 3A) formed with a rectangular opening in it. The material metal sheet may be made of a light metal such as Mg, Al and Ti, or light alloy whose main component is one of these light metals. Then, the semimanufactured base 1' is bent so that the rectangular opening is located in the resultant upright wall Referring to FIG. 4, the other components of the housing 10, namely, the sidewall frame 2, the bosses 3 and the rib 4 are prepared separately from the housing base 1. The sidewall frame 2 may be made of a light metal such as Mg, Al and Ti, or light alloy whose main component is one of these light metals, by employing a die-casting, thixo molding or forging technique. The produced sidewall frame 2 is subjected to a deburring or flash-removing operation to remove flashes formed on the casting. In general, a flash-removing operation includes two steps: a punching step to remove flashes and a subsequent polishing step to file or grind the deburred portion (and other portions as well) for providing a smooth surface. In the present embodiment, however, only the flash-removing step is performed with respect to the frame 2, but the filing or grinding step is not performed. Thus, in the frame 2, the portions to be attached to the housing base 1 (and other portions as well) remain to be rough. The technical significance of this will be described later.

The bosses 3 and the rib 4 may be made by cutting a rod or sheet of a light metal such as Mg, Al and Ti, or light alloy whose main component is one of these light metals. As for the bosses 3, the cut metal pieces are formed with a threaded hole by a tap.

Figure 5A:
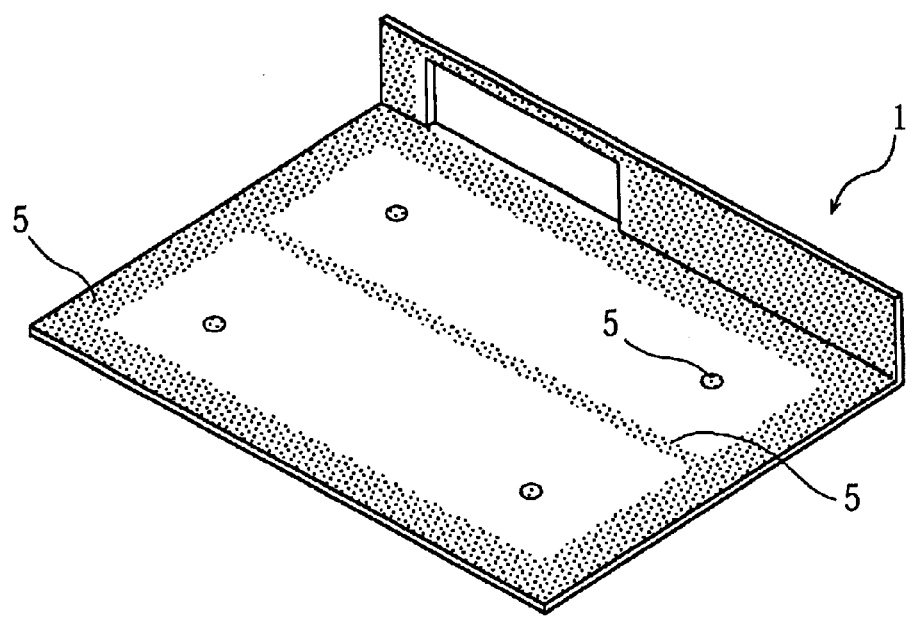
FIGS. 5A–5B show how the auxiliary components are fixed to the housing base.
Figure 5B:
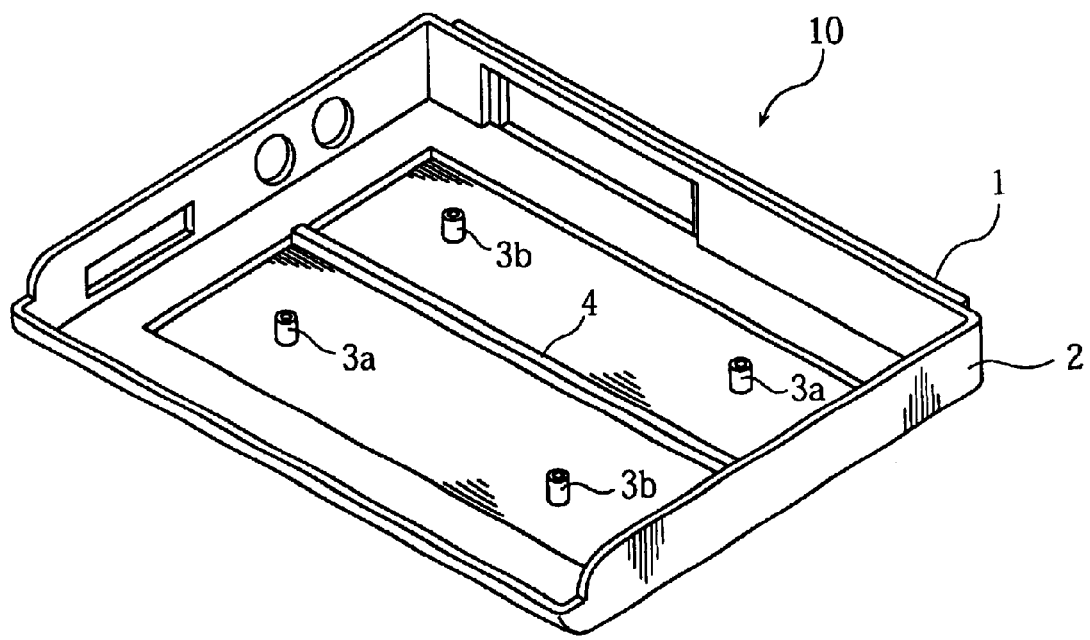

Referring to FIG. 5A, after the above-mentioned parts are prepared, the adhesive 5 is applied to the prescribed portions of the housing base 1. Then, as shown in FIG. 5B, the sidewall frame 2, the bosses 3a, 3b and the rib 4 are put in place. The respective deposits of the applied adhesive 5 will be made electroconductive or non-electroconductive in accordance with the prescribed circuit design. In the illustrated embodiment, the bosses 3b are pressed against the base 1 with a relatively strong force so that the relevant adhesive deposits are made electroconductive. On the other hand, the other auxiliary parts (the frame 2, the bosses 3a and the rib 4) are pressed against the base 1 with a relatively weak force so that the relevant adhesive deposits remain to be non-electroconductive.

Thereafter, to accelerate the hardening of the applied adhesive 5, the provisionally assembled housing unit (FIG. 5B) is brought into a thermostatic chamber for heating the applied adhesive.

In the above embodiment, the metal particles 7 in the adhesive 5 are coated by an insulating layer 8 (FIG. 2). According to the present invention, however, no such insulating layer may be provided, and the metal particles 7 may be exposed to the base resin 6. In this instance, the housing base 1 may be electrically connected to all the auxiliary parts of the metal housing 10.

Hereinbelow, examples of metal housings will be described.

EXAMPLE 1

A sidewall frame, a prescribed number of bosses and a housing base were produced. Specifically, the sidewall frame was made of a magnesium alloy (AZ91D) by thixo molding. The flashes produced on the frame were removed by press working. The bosses were made by cutting a Mg-alloy rod (AZ91D, 5 mm in diameter) into 10 mm-long pieces and then tapping a threaded hole (2.5 mm in diameter) in each piece. The housing base was produced from a Mg-alloy sheet (AZ31D, 0.8 mm in thickness) by sheet metal forming. Thereafter, an adhesive was applied to the prescribed portions of the housing base, as in the embodiment of FIG. 5A, for fixation of the sidewall frame and the bosses. The adhesive contained an epoxy resin (Trade name "Araldite" by Ciba-Geigy Japan Ltd.) as base resin and 10 wt % of Mg powder having an average particle diameter of 10 μm. With the applied adhesive, the sidewall frame and the bosses were provisionally fixed to the housing base. For this provisional fixation, the frame and the bosses were pressed against the housing base so that a pressure of 5 kgf/cm$^2$ was exerted between the housing base and each of the auxiliary parts (i.e. the frame and the bosses). Following the provisional fixation, the assembled housing was heated up to 60° C. in a thermostatic chamber to accelerate the hardening of the adhesive.

After the auxiliary parts were completely fixed to the housing base, conductivity checks were performed to see whether or not the auxiliary parts were electrically connected to the housing base. The results were that both the bosses and the sidewall frame were electrically connected to the housing base via the applied adhesive. This was because the Mg particles contained in the adhesive had been brought into contact with each other under the pressure exerted in performing the provisional fixation.

Advantageously, the metal housing of Example 1 suffered substantially no electrolytic corrosion since all of the housing base, the metal particles in the adhesive and the auxiliary parts (i.e. the sidewall frame and the bosses) were made of the same material (i.e. Mg-alloy). Further, with respect to each of the threaded bosses, a screw (2.5 mm in diameter) was screwed (by a torque of 34 Ncm) and unscrewed several ten times to see if the boss was fixed to the housing base stably. The result was that the boss did not come off the housing base by the repeated screwing/unscrewing operation. In addition, no slippage of the screw within the threaded hole nor no chipping of the thread ridges were observed.

After taken out from the mold, the sidewall frame was subjected to punching for flash-removing, but not to filing or grinding for finer surface treatment. Therefore, the sidewall frame had rather rough areas to be brought into contact with the housing base. These rough areas of the sidewall frame were advantageous to achieving strong fixation to the housing base (the "anchor effect"). Without the finer surface treatment being performed, it is possible to simplify the production procedure of the metal housing and reduce the production cost.

EXAMPLE 2

A sidewall frame was made of an aluminum alloy (ADC12) by die-casting. After the molding, the casting was subjected to flash-removing by press working. Then, prescribed surfaces of the sidewall frame were subjected to paint application by spraying. A prescribed number of bosses were made by cutting a Mg-alloy rod (AZ91D, 5 mm in diameter) into 10 mm-long pieces and then tapping a threaded hole (2.5 mm in diameter) in each piece. As for the housing base, an Al-alloy sheet (A5052, 0.7 mm in thickness) was subjected to anodizing to be colored, and then to sheet metal forming to provide the required housing base. Thereafter, an adhesive was applied to the prescribed portions to which the sidewall frame or the bosses were to be glued. The adhesive contained acrylic resin (Trade name "Diabond" by Nogawa Chemical) as a base resin, 10 wt % of a polyethylene powder (10 μm in average diameter) and 10 wt % of an Al-alloy powder (A1100, 10 μm in average diameter). For provisional fixation, the sidewall frame and the bosses were pressed against the adhesive-applied portions under a pressure of 5 kgf/cm², as in Example 1. Following the provisional fixation, the assembled housing was heated up to 60° C. in a thermostatic chamber to accelerate the hardening of the adhesive.

In Example 2 again, it was found that the bosses and the sidewall frame were electrically connected to the housing base. Further, the bosses were firmly attached to the housing base, as in Example 1, and the anchoring effect between the housing base and the sidewall frame was also obtained. Still further, the sidewall frame and the bosses were easily detached from the housing base after the metal housing had been kept at a temperature of 100° C. for 30 minutes in a thermostatic chamber.

EXAMPLE 3

A sidewall frame was made of a magnesium alloy (AZ91D) by die-casting. After the molding, the casting was subjected to flash-removing by press working. A prescribed number of bosses were made by cutting an Al-alloy rod (A5052, 5 mm in diameter) into 10 mm-long pieces and then tapping a threaded hole (2.5 mm in diameter) in each piece. As for the housing base, an Al-alloy sheet (A5052, 0.7 mm in thickness) was subjected to sheet metal forming to provide the required housing base. Thereafter, an adhesive was applied to the prescribed portions to which the sidewall frame or the bosses were to be glued. The adhesive contained a non-yellowing type urethane resin (Trade name "Mophen" by Sumitomo Bayer Urethane) as a base resin, and 10 wt % of Al-alloy powder (A1100, 10 μm in average diameter), where the respective particles of the Al-alloy powder were encapsulated by epoxy resin. For provisional attachment, the bosses were pressed against the adhesive-applied portions under a pressure of 5 kgf/cm², while the sidewall frame was pressed against the adhesive-applied portions under a pressure of 1 kgf/cm². Following the provisional attachment, the assembled housing was heated up to 60° C. in a thermostatic chamber to accelerate the hardening of the adhesive.

In Example 3, it was found that the bosses were electrically connected to the housing base, whereas the sidewall frame was insulated from the housing base. The bosses were firmly attached to the housing base, as in Example 1, and the anchoring effect between the housing base and the sidewall frame was also obtained.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A metal housing comprising:

a housing base made of metal;

a first housing component made of metal; and a second housing component made of metal; and an adhesive that contains metal powder consisting of metal particles;

wherein the first and second housing components are fixed to the housing base by the adhesive; and wherein the first housing component is electrically connected to the housing base, the second housing component being electrically unconnected to the housing base.

2. The metal housing according to claim 1, wherein the housing base is prepared by sheet metal forming, the housing component being prepared by one of die-casting, thixo molding and forging.

3. The metal housing according to claim 1, wherein the metal powder comprises a same metal as at least one of the housing base and the housing component does.

4. The metal housing according to claim 3, wherein the metal powder has a same composition of metal as at least one of the housing base and the housing component does.

5. The metal housing according to claim 1, wherein the metal particles are microencapsulated by an insulating resin layer, and wherein the metal particles in the adhesive for fixing the first housing component to the housing base are held in direct contact by rupture of the insulating resin layer.

6. The metal housing according to claim 1, wherein at least one of the housing base and the housing component is made of a metal selected from a group consisting of Mg, Al, Mg alloy and Al alloy.

7. The metal housing according to claim 1, wherein the metal particles are made of a metal selected from a group consisting of Mg, Al, Mg alloy and Al alloy.

8. The metal housing according to claim 1, wherein the adhesive comprises a resin selected from a group consisting of epoxy resin, acrylic resin and urethane resin.

9. The metal housing according to claim 1, wherein the adhesive comprises a thermoplastic resin.

10. The metal housing according to claim 9, wherein the thermoplastic resin is selected from a group consisting of polyethylene, polypropylene and polystyrene.

11. A metal housing comprising:

a housing base made of metal;

a housing component made of metal; and an adhesive that contains metal powder consisting of metal particles;

wherein the housing component is fixed to the housing base by the adhesive; and wherein the adhesive contains a base resin selected from a group consisting of epoxy resin, acrylic resin and urethane resin, the adhesive further containing a thermoplastic resin selected from a group consisting of polyethylene, polypropylene and polystyrene.

* * * * *